(12) United States Patent
Bai et al.

(10) Patent No.: US 10,247,976 B2
(45) Date of Patent: Apr. 2, 2019

(54) DISPLAY PANEL AND METHOD FOR MANUFACTURING THE SAME, ELECTRONIC PAPER INCLUDING THE SAME AND DRIVING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Bing Bai, Beijing (CN); Inho Park, Beijing (CN); Weitao Chen, Beijing (CN); Hanyan Sun, Beijing (CN); Na Li, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/677,774

(22) Filed: Aug. 15, 2017

(65) Prior Publication Data
US 2018/0088382 A1 Mar. 29, 2018

(30) Foreign Application Priority Data
Sep. 29, 2016 (CN) .......................... 2016 1 0866529

(51) Int. Cl.
| | | |
|---|---|---|
| *G02F 1/1333* | (2006.01) | |
| *H01L 27/12* | (2006.01) | |
| *G09G 3/34* | (2006.01) | |
| *G06F 3/041* | (2006.01) | |
| *G02F 1/1335* | (2006.01) | |

(52) U.S. Cl.
CPC .... *G02F 1/13338* (2013.01); *G02F 1/133382* (2013.01); *G06F 3/0412* (2013.01);
(Continued)

(58) Field of Classification Search
CPC .......... G02F 1/13338; G02F 1/133382; G02F 1/133553; H01L 27/1214; G09G 3/3433;
(Continued)

(56) References Cited

U.S. PATENT DOCUMENTS

| | | | | |
|---|---|---|---|---|
| 5,616,416 A | * | 4/1997 | Yamaguchi | ............... G09F 9/37 359/628 |
| 2005/0211694 A1 | | 9/2005 | Moroz | |

(Continued)

FOREIGN PATENT DOCUMENTS

| | | |
|---|---|---|
| CN | 101813881 A | 8/2010 |
| CN | 103439846 A | 12/2013 |

(Continued)

OTHER PUBLICATIONS

First Office Action for Chinese Application No. 201610866529.0, dated Jul. 3, 2018, 9 Pages.

*Primary Examiner* — Temesghen Ghebretinsae
*Assistant Examiner* — Ivelisse Martinez Quiles
(74) *Attorney, Agent, or Firm* — Brooks Kushman P.C.

(57) ABSTRACT

A display panel and a method for manufacturing the same, an electronic paper and a driving method thereof are provided. The display panel includes: a first base substrate, a second base substrate arranged oppositely to the first base substrate, and multiple temperature-induced transmittance reversible components which not contacted with each other and arranged in an array between the first base substrate and the second base substrate. Each of the temperature-induced transmittance reversible components includes: a temperature-induced transmittance reversible unit and a temperature control unit. The temperature control unit is used to adjust temperature of the temperature-induced transmittance
(Continued)

reversible unit to control transmittance of the temperature-induced transmittance reversible unit with respect to the visible light.

18 Claims, 3 Drawing Sheets

(52) U.S. Cl.
CPC .......... *G09G 3/344* (2013.01); *G09G 3/3433* (2013.01); *H01L 27/1214* (2013.01); *G02F 1/133553* (2013.01); *G09G 2300/08* (2013.01)

(58) Field of Classification Search
CPC ... G09G 3/344; G09G 2300/08; G06F 3/0412
See application file for complete search history.

(56) References Cited

U.S. PATENT DOCUMENTS

| | | | |
|---|---|---|---|
| 2007/0285775 A1* | 12/2007 | Lesage | G02F 1/0147 359/465 |
| 2008/0297676 A1* | 12/2008 | Kimura | G02F 1/13624 349/39 |
| 2009/0173938 A1* | 7/2009 | Honda | H01L 29/7869 257/43 |
| 2011/0157672 A1* | 6/2011 | Liu | G02F 1/0147 359/267 |
| 2011/0157674 A1* | 6/2011 | Liu | G02F 1/17 359/288 |
| 2012/0189820 A1* | 7/2012 | Hakim | G02F 1/0147 428/188 |
| 2014/0104670 A1* | 4/2014 | Feng | G02F 1/0147 359/288 |
| 2015/0338714 A1 | 11/2015 | Li | |
| 2017/0212398 A1 | 7/2017 | Cao et al. | |

FOREIGN PATENT DOCUMENTS

| | | |
|---|---|---|
| CN | 104216146 A | 12/2014 |
| CN | 104965338 A | 10/2015 |
| CN | 105870153 A | 8/2016 |
| EP | 1429174 A2 | 6/2004 |
| JP | 2003241156 A | 8/2003 |

* cited by examiner

DISPLAY PANEL AND METHOD FOR MANUFACTURING THE SAME, ELECTRONIC PAPER INCLUDING THE SAME AND DRIVING METHOD THEREOF

CROSS-REFERENCE TO RELATED APPLICATION

This application claims priority to Chinese patent application No. 201610866529.0, filed with the Chinese State Intellectual Property Office on Sep. 29, 2016, which is incorporated herein by reference in its entirety.

TECHNICAL FIELD

The present disclosure relates to the field of display technology, and in particular, to a display panel and a method for manufacturing the same, an electronic paper and a driving method thereof.

BACKGROUND

Nowadays, the field of electronic papers grows vigorously. For most of the electronic papers, the display is achieved by relying on the reflected light, and there is no need to provide an additional light source, with less damage to eyes, compared with the liquid crystal electronic paper. Moreover, power is provided only when the screen changes, with bi-stable characteristics and low power consumption, and most of the electronic papers have a thin thickness, are bendable and very suitable for the future development needs of handheld devices.

Electronic papers have become a hot spot studied by manufacturers. However, the type of the current electronic papers is single, and there is a need to continually research the electronic papers.

SUMMARY

A novel display panel and a method for manufacturing the same, an electronic paper and a driving method thereof are provided according to embodiments of the present disclosure.

In order to achieve the above object, the following technical solutions are provided in the embodiments of the present disclosure.

In a first aspect, a display panel is provided according to the present disclosure, which includes: a first base substrate, a second base substrate arranged oppositely to the first base substrate, and a plurality of temperature-induced transmittance reversible components that are not contacted with each other and arranged in an array between the first base substrate and the second base substrate. Each of the temperature-induced transmittance reversible components includes a temperature-induced transmittance reversible unit and a temperature control unit, the temperature control unit is configured to adjust temperature of the temperature-induced transmittance reversible unit to control transmittance of the temperature-induced transmittance reversible unit with respect to visible light.

Optionally, the temperature control unit is a heating unit and the heating unit is in contact with the temperature-induced transmittance reversible unit.

Optionally, the display panel further includes a thermal insulating layer which separates all the temperature-induced transmittance reversible components from each other.

Optionally, the temperature-induced transmittance reversible unit is a mixture of a water-soluble polymer, an inorganic salt and water.

Optionally, the water-soluble polymer is any one or combination of polystyrene, oxidized polypropylene, polyvinyl alcohol, hydroxyethylcellulose, hydroxypropylcellulose, and the inorganic salt is any one or combination of sodium salt, potassium salt, magnesium salt, calcium salt.

Optionally, the temperature-induced transmittance reversible unit is a mixture of a water-soluble polymer, an inorganic salt, a curing agent and water.

Optionally, the display panel further includes a transparent packaging layer. The transparent packaging layer packages the temperature-induced transmittance reversible components.

Optionally, the display panel further includes a plurality of gate lines and data lines which are crisscrossed, a voltage line and a plurality of thin film transistors. Each of the temperature-induced transmittance reversible components corresponds to one of the thin film transistors. Gate electrodes of the thin film transistors in each line are connected to one of the gate lines, drain electrodes of the thin film transistors in each line are connected to first connection terminals of the heating units in each line, source electrodes of the thin film transistors in each line are connected to one of the data lines, and a second connection terminal of each of the heating units is connected to the voltage line.

Optionally, the display panel further includes a plurality of reflection units arranged in an array. Each of the reflection units is composed of monochrome reflection subunits for reflecting light waves of different colors. Each of the monochrome reflection subunits corresponds to one of the temperature-induced transmittance reversible components in a direction perpendicular to the display panel, and different monochrome reflection subunits correspond to different temperature-induced transmittance reversible components. The temperature-induced transmittance reversible component and the reflection unit are arranged sequentially in a light incidence direction of the display panel.

Optionally, the monochrome reflection subunit includes: a reflection subunit and a monochrome subunit, the monochrome subunit is capable of passing only light of one color through. The monochrome subunit and the reflection subunit are arranged sequentially in the light incidence direction of the display panel.

Optionally, the reflection unit includes: a red reflection subunit, a green reflection subunit and a blue reflection subunit.

Optionally, the display panel further includes black matrices arranged among the monochrome reflection subunits.

Optionally, the temperature-induced transmittance reversible component and the reflection unit are arranged on an inside of one of the first base substrate and the second base substrate.

Optionally, the temperature-induced transmittance reversible component and the reflection unit are arranged on an inside of the first base substrate and an inside of the second base substrate, respectively.

Optionally, in each of the temperature-induced transmittance reversible components, the temperature control unit is within the temperature-induced transmittance reversible unit.

In a second aspect, an electronic paper is provided according to the present disclosure, which includes: the display panel according to any one of the described above.

In a third aspect, a driving method for an electronic paper is provided according to the present disclosure. The display panel of the electronic paper further includes: a plurality of gate lines and data lines which are crisscrossed, a voltage line and a plurality of thin film transistors, each of the temperature-induced transmittance reversible components corresponds to one of the thin film transistors, gate electrodes of the thin film transistors in each line are connected to one of the gate lines, drain electrodes of the thin film transistors in each line are connected to first connection terminals of the heating units in each line, source electrodes of the thin film transistors in each line are connected to one of the data lines, and a second connection terminal of each of the heating units is connected to the voltage line; the temperature control unit is a heating unit, and the heating unit is in contact with the temperature-induced transmittance reversible unit. The method includes: inputting a scanning signal to each of gate lines sequentially according to sequences of the gate lines; and inputting a data signal to the source electrodes of the thin film transistors connected to any one of the gate lines through the data lines to control the heating units connected to the thin film transistors to generate heat, when the gate line is scanned.

In a fourth aspect, a method for manufacturing a display panel is provided according to the disclosure, which includes: forming a plurality of temperature-induced transmittance reversible components that are not contacted with each other and arranged in an array on a substrate, in such a manner that each of the temperature-induced transmittance reversible components includes a temperature-induced transmittance reversible unit and a temperature control unit, and the temperature control unit is configured to adjust temperature of the temperature-induced transmittance reversible unit to control transmittance of the temperature-induced transmittance reversible unit with respect to visible light.

Optionally, the forming a plurality of temperature-induced transmittance reversible components that are not contacted with each other and arranged in an array on the substrate specifically includes: forming a temperature-induced transmittance reversible film on the substrate and patterning the temperature-induced transmittance reversible film to form a plurality of temperature-induced transmittance reversible units that are not contacted with each other and arranged in an array. The temperature-induced transmittance reversible film is made by mixing a water-soluble polymer, an inorganic salt, a curing agent and water.

Optionally, the method further includes: forming a thermal insulating film on the substrate and patterning the thermal insulating film to form a netlike thermal insulating layer. The forming a plurality of temperature-induced transmittance reversible components that are not contacted with each other and arranged in an array on the substrate specifically includes: filling a fluid temperature-induced transmittance reversible material into netlike regions of the thermal insulating layer. The temperature-induced transmittance reversible material is obtained by mixing a water-soluble polymer, an inorganic salt and water.

BRIEF DESCRIPTION OF THE DRAWINGS

In order to explain the technical solutions in embodiments of the present disclosure or the related art more clearly, accompanying drawings needed in the description of the embodiments or the related art are briefly illustrated hereinafter. Apparently, the accompanying drawings described hereinafter show only some embodiments of the present disclosure, and those skilled in the art can further conceive other drawings according to the drawings without creative work.

DETAILED DESCRIPTION OF THE EMBODIMENTS

Figure 1:
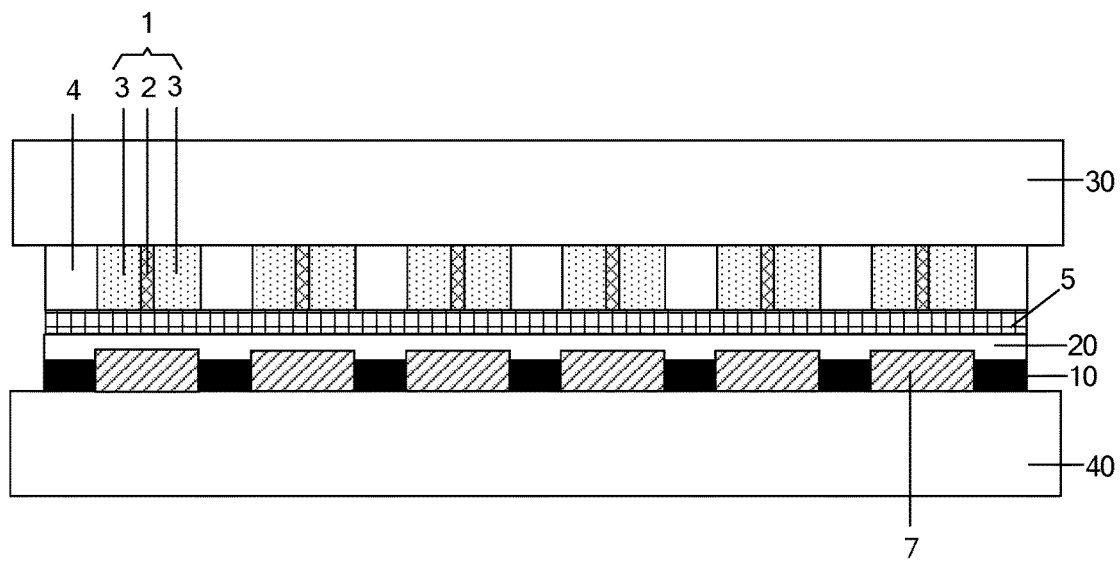
FIG. 1 is a first schematic structural diagram of a display panel according to an embodiment of the present disclosure.

In the following, the technical solutions in embodiments of the present disclosure are described clearly and completely in conjunction with the accompanying drawings of the embodiments of the present disclosure. It is apparent that the described embodiments are only a part of embodiments of the present disclosure. Other embodiments obtained by those skilled in the art on the basis of the described embodiments of the present disclosure without creative work fall into the scope of protection of the present disclosure.

In the description of the present disclosure, it is to be understood that the location or position relationship indicated by the term "on/above" or the like is the location or position relationship shown in the drawings, it is just convenient to describe the present disclosure and simplify the description, but does not indicate or imply that the indicated device or element must have a specific location, be constructed and operated in the specific location, thus, which cannot be construed as the limit of the present disclosure.

A display panel is provided according to an embodiment of the present disclosure, referring to FIG. 1, which includes: a first base substrate 30 and a second base substrate 40 arranged oppositely to each other. The display panel further includes multiple temperature-induced transmittance reversible components 1, which are not contacted with each other and are arranged in an array. Each of the temperature-induced transmittance reversible components is arranged on the inside of the first base substrate or the second base substrate and includes: a temperature-induced transmittance reversible unit 3 and a temperature control unit 2. The temperature control unit 2 is used to adjust temperature of the temperature-induced transmittance reversible unit 3 to control transmittance of the temperature-induced transmittance reversible unit 3 with respect to visible light.

The specific material of the temperature-induced transmittance reversible unit and the specific structure of the temperature control unit are not defined herein, as long as the above-described requirements are satisfied.

The "reversible" in the above-described temperature-induced transmittance reversible component means that, if the transmittance of the temperature-induced transmittance reversible component with respect to the visible light is A1 at temperature T1, and the transmittance of the temperature-induced transmittance reversible component with respect to the visible light is A2 when the temperature is raised to T2, the transmittance of the temperature-induced transmittance reversible component with respect to the visible light is still A1 when the temperature is dropped to T1.

The above-described temperature-induced transmittance reversible components may be separated from each other by a separation structure such as air, a thermal insulating layer, and the separation structure is not defined herein.

The above-mentioned inside of the first base substrate refers to a side of the first base substrate opposite to the second base substrate, the inside of the second base substrate refers to a side of the second base substrate opposite to the first base substrate, the temperature-induced transmittance reversible components may be arranged on the inside of the first base substrate, or may also be arranged on the inside of the second base substrate, which is not defined herein. The embodiments and the drawings of the present disclosure are illustrated by taking the temperature-induced transmittance reversible components being arranged on the inside of the first base substrate as an example.

The temperature-induced transmittance reversible components are arranged in the display panel, which has different transmittances with respect to the visible light at different temperatures. The display panel is applied into the electronic paper, and the amount of incident light can be controlled, thereby achieving different displays.

Figure 2:
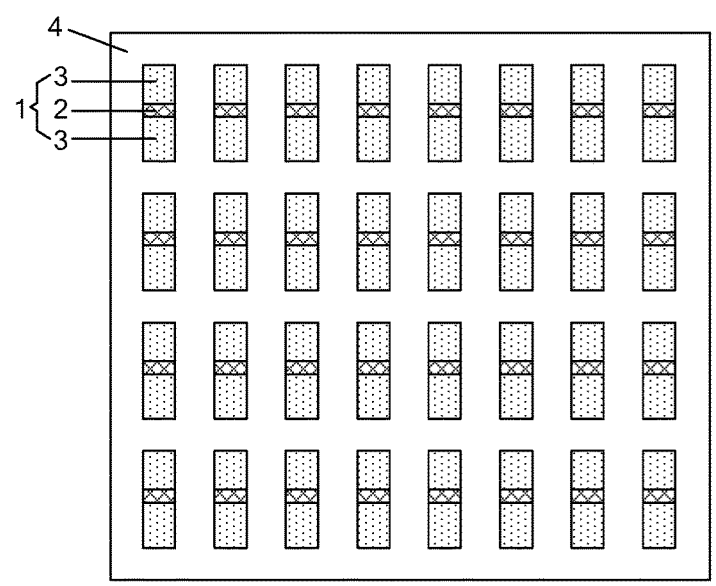
FIG. 2 is a schematic structural diagram of a temperature-induced transmittance reversible component and a thermal insulating layer according to an embodiment of the present disclosure.

Optionally, the temperature control unit is a heating unit, and the heating unit is contacted with the temperature-induced transmittance reversible unit. In this case, the temperature of the temperature-induced transmittance reversible unit can be increased by the heating unit, and thus the transmittance of the temperature-induced transmittance reversible unit with respect to the visible light can be changed. The relative position of the heating unit and the temperature-induced transmittance reversible unit is not defined herein, the heating unit may be arranged at a middle position of the temperature-induced transmittance reversible unit as shown in FIG. 1 and FIG. 2, of course, the heating unit may be arranged at other positions, as long as the heating unit is contacted with the temperature-induced transmittance reversible unit. The embodiments and the drawings of the present disclosure are illustrated by taking the structure shown in FIG. 2 as an example.

Optionally, in conjunction with FIG. 1 and FIG. 2, the display panel further includes: a thermal insulating layer 4 which separates all the temperature-induced transmittance reversible components 1 from each other. Since the temperature-induced transmittance reversible components are arranged in an array, the thermal insulating layer may be a netlike structure.

Optionally, the temperature-induced transmittance reversible unit may be obtained by mixing a water-soluble polymer, an inorganic salt and water. Optionally, the water-soluble polymer is any one or combination of polystyrene, oxidized polypropylene, polyvinyl alcohol, hydroxyethylcellulose, hydroxypropylcellulose, and the inorganic salt is any one or combination of sodium salt, potassium salt, magnesium salt, calcium salt. The temperature-induced transmittance reversible unit made of the above-mentioned materials has characteristics as follows.

The transmittance of the temperature-induced transmittance reversible unit with respect to the visible light is lower, about in a range from 10% to 30%, when the temperature is above a transition temperature. The transmittance of the temperature-induced transmittance reversible unit with respect to the visible light is higher, about in a range from 70% to 90%, when the temperature is below the transition temperature. The transition temperature at which the transmittance is transformed is in a range from 20 Celsius degrees to 40 Celsius degrees. The specific values are determined according to materials and a proportion used in practice. The temperature-induced transmittance reversible unit formed of the above-mentioned material is liquid and has fluidity.

In order to form a solid temperature-induced transmittance reversible unit, optionally, the temperature-induced transmittance reversible unit is made by mixing a water-soluble polymer, an inorganic salt, a curing agent and water. The curing agent may be Xanthan gum, carrageenan, gellan gum or the like herein.

Optionally, referring to FIG. 1, the display panel further includes a transparent packaging layer 5. The transparent packaging layer 5 is used to package the temperature-induced transmittance reversible components 1 to protect the temperature-induced transmittance reversible components.

Figure 5:
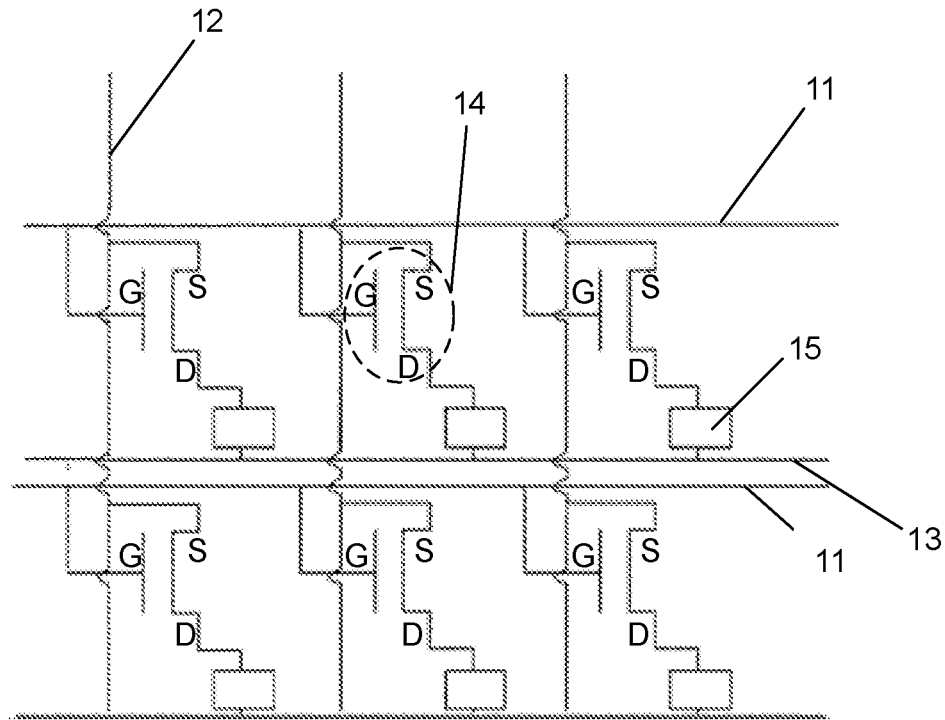
FIG. 5 is a third schematic structural diagram of a display panel according to an embodiment of the present disclosure.

Optionally, referring to FIG. 5, the display panel further includes: multiple gate lines 11 and data lines 12 which are crisscrossed, a voltage line 13 and multiple thin film transistors 14. Each of the temperature-induced transmittance reversible components corresponds to one of the thin film transistors; gate electrodes G of the thin film transistors 14 in each line are connected to one of the gate lines 11, drain electrodes D of the thin film transistors 14 in each line are connected to first connection terminals of the heating units 15 in each line, source electrodes S of the thin film transistors 14 in each line are connected to one of the data lines 12, and a second connection terminal of each of the heating units 15 is connected to the voltage line 13. The specific structure of the heating unit is not limited herein. For example, the heating unit may be a resistor. The voltage line may be a wiring line such as a ground line.

In this way, the gate lines, the data lines and the thin film transistors may be used to control the heating units to generate heat, and thus the transmittance of each of the temperature-induced transmittance reversible components with respect to the visible light is controlled. For example, the heating unit being a resistor is taken as example. When the resistor is needed to provide heat, the gate line provides a scanning voltage to turn on the thin film transistor, then a voltage on the data line is provided to the resistor via the thin film transistor, and the resistor generates heat. The amount of heat generated by the resistor can be controlled by changing the voltage on the data line. This way is simple, efficient and easy to be implemented, with low cost, which may be implemented by means of the existing equipment for manufacturing TFT-LCD.

Figure 3:
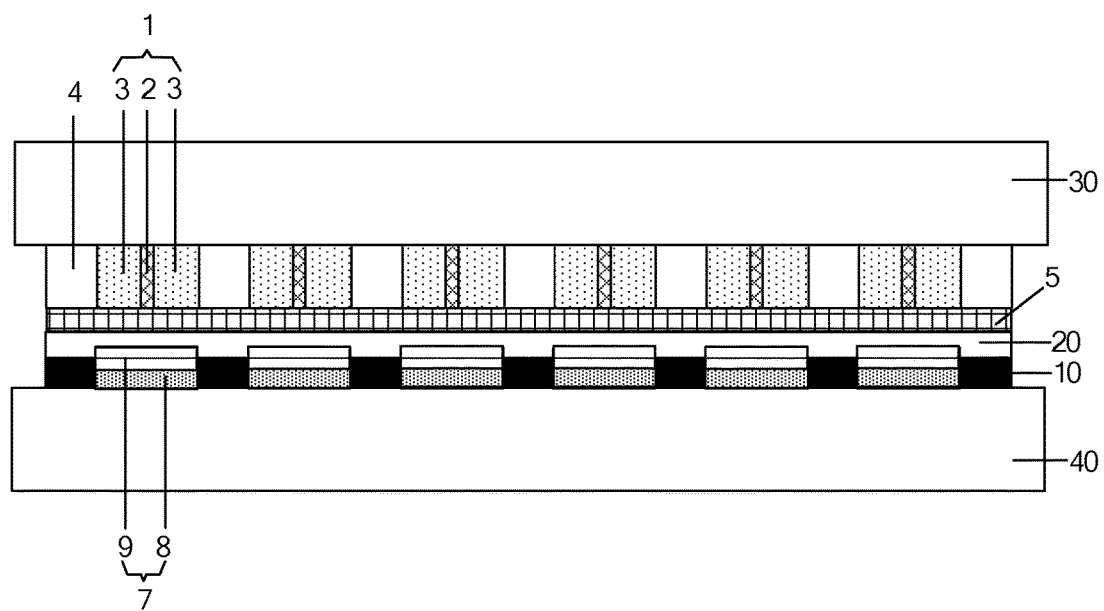
FIG. 3 is a second schematic structural diagram of a display panel according to an embodiment of the present disclosure.
Figure 4:
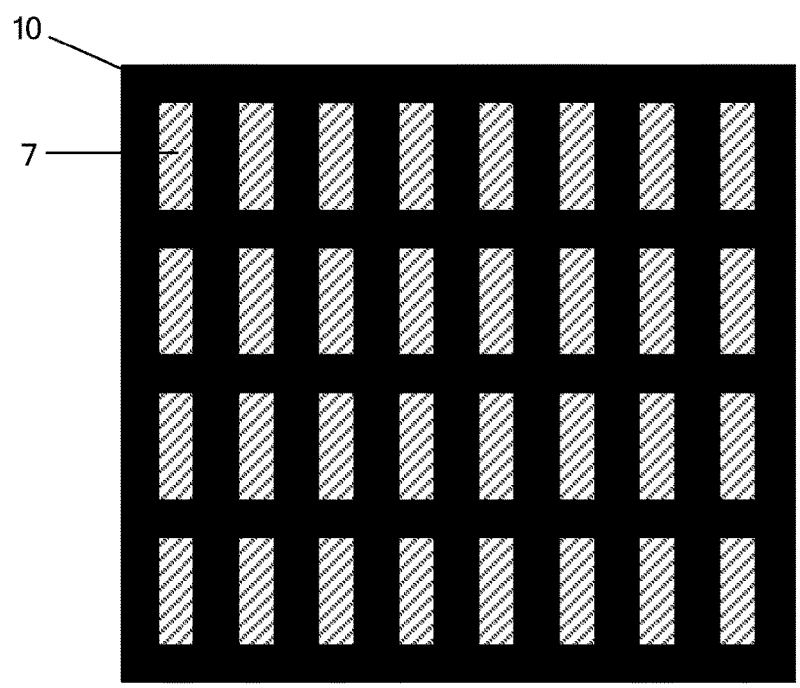
FIG. 4 is a schematic structural diagram of a monochrome reflection subunit and a black matrix according to an embodiment of the present disclosure.

Optionally, referring to FIG. 3 and FIG. 4, the display panel further includes multiple reflection units arranged in an array, each of the reflection unit is composed of monochrome reflection subunits 7 for reflecting light waves of different colors. Each of the monochrome reflection subunits 7 corresponds to one of the temperature-induced transmittance reversible components 1 in a direction perpendicular to the display panel, and different ones of the monochrome reflection subunits 7 correspond to different ones of the temperature-induced transmittance reversible components 1. The temperature-induced transmittance reversible component and the reflection unit are arranged sequentially in a light incidence direction of the display panel; the temperature-induced transmittance reversible component and the reflection unit are arranged on the inside of the same substrate, or the temperature-induced transmittance reversible component and the reflection unit are arranged on the insides of different substrates respectively.

It should be noted that the above-mentioned light incidence direction of the display panel may be a direction of incidence from the first base substrate, or may also be a direction of incidence from the second base substrate, which is not defined herein. The embodiments and the drawings of the present disclosure are illustrated by taking the light incidence direction of the display panel being the direction of incidence from the first base substrate as an example.

The temperature-induced transmittance reversible component and the reflection unit being arranged on the inside of the same substrate described above means that: the temperature-induced transmittance reversible component and the reflection unit are arranged on the inside of the first base substrate, or may also be arranged on the inside of the second base substrate. The temperature-induced transmittance reversible component and the reflection unit being arranged on the insides of different substrates respectively described above means that: when the light incidence direction of the display panel is the direction of incidence from the first base substrate, the temperature-induced transmittance reversible component is arranged on the inside of the first base substrate, and the reflection unit is arranged on the inside of the second base substrate; when the light incidence direction of the display panel is the direction of incidence from the second base substrate, the temperature-induced transmittance reversible component is arranged on the inside of the second base substrate, and the reflection unit is arranged on the inside of the first base substrate.

The specific condition for the monochrome reflection subunits included in the reflection unit is not defined herein. For example, the reflection unit may include three monochrome reflection subunits, that is, a red reflection subunit, a green reflection subunit and a blue reflection subunit. Of course, the reflection unit may further include a yellow reflection subunit.

In this case, after the external light is incident on the reflection unit through the temperature-induced transmittance reversible components, light of one color can be reflected by each of the monochrome reflection subunits included in the reflection unit, and light of different colors can be reflected by the reflection unit after light reflected by multiple monochrome reflection subunits is mixed.

Optionally, referring to FIG. 3, the monochrome reflection subunit 7 includes: a reflection subunit 8 and a monochrome subunit 9, the monochrome subunit is capable of passing only light of one color through; the monochrome subunit 9 and the reflection subunit 8 are arranged sequentially in a light incidence direction of the display panel. Such structure is simple and easy to be implemented.

Optionally, the reflection unit includes: a red reflection subunit, a green reflection subunit and a blue reflection subunit. Light of different colors can be reflected by the reflection unit based on the three-primary-color principle.

Optionally, referring to FIG. 3 and FIG. 4, the display panel further includes black matrices 10 arranged among the monochrome reflection subunits 7, in order to avoid the mutual interference between the adjacent monochrome reflection subunits.

The display panel can be fabricated on the basis of the original equipment for manufacturing TFT-LCD (Thin Film Transistor-Liquid Crystal Display). For the manufacturer of the liquid crystal display device, there is no need to re-establish a production line to manufacture the electronic paper, greatly improving the use efficiency of the equipment, and reducing cost.

Additionally, in a case that the temperature-induced transmittance reversible component is arranged on the inside of the first base substrate and the reflection unit is arranged on the inside of the second base substrate, after the reflection unit is arranged on the inside of the second base substrate, a planarization layer 20 as show in FIG. 1 and FIG. 3 may be arranged on the reflection unit to protect and planarize the reflection unit.

It should be noted that, in FIG. 1 and FIG. 3, the light incidence direction of the display panel is the direction of incidence from the first base substrate, the temperature-induced transmittance reversible components 1, the thermal insulating layer 4 and the transparent packaging layer 5 are arranged on the inside of the first base substrate to construct a first substrate, the monochrome reflection subunits 7, black matrices 10 and the planarization layer 20 are arranged on the inside of the second base substrate to construct a second substrate. The first substrate and the second substrate are oppositely arranged in a cell to form the display panel. The gate lines, the data lines, the voltage line and multiple thin film transistors may be arranged on the inside of the first base substrate, or may also be arranged on the inside of the second base substrate, which is not defined herein.

An electronic paper is provided according to an embodiment of the present disclosure, which includes the display panel described above. Temperature-induced transmittance reversible components are arranged in the electronic paper, and the transmittance of the temperature-induced transmittance reversible components with respect to the visible light can be controlled by adjusting the temperature of the temperature-induced transmittance reversible components. Moreover, after the external light is incident on the monochrome reflection subunits through the temperature-induced transmittance reversible components, light of different colors is reflected by different monochrome reflection subunits, achieving the color display. Compared with the electrophoresis way and the capsule rotating ball way in the related art, an electronic paper using the temperature-induced transmittance reversible components is provided according to the embodiment of the present disclosure, which has advantages of a simple fabrication process and low colorized cost.

Figure 6:
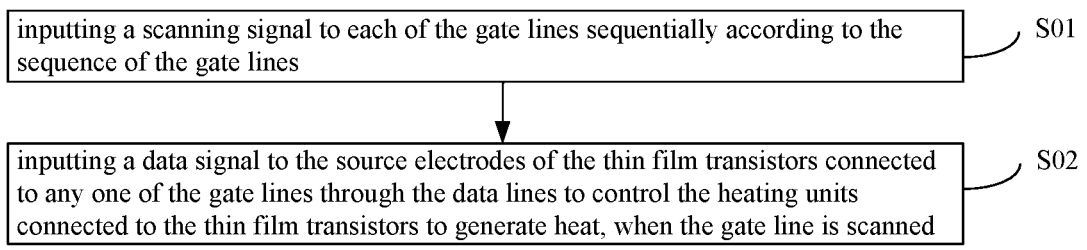
FIG. 6 is a schematic flowchart of a method for manufacturing a display panel according to an embodiment of the present disclosure.

A driving method for the above-described electronic paper is provided according to an embodiment of the present disclosure. Referring to FIG. 6, the method includes the following steps.

Step S01 is to input a scanning signal to each of the gate lines sequentially according to the sequence of the gate lines.

Step S02 is to input a data signal to the source electrodes of the thin film transistors connected to any one of the gate lines through the data lines to control the heating units connected to the thin film transistors to generate heat, when the gate line is scanned.

In this case, the gate lines, data lines and the thin film transistors can be used to control the heating units to generate heat, and thus the transmittance of each of the temperature-induced transmittance reversible components with respect to the visible light can be controlled, thereby achieving the display of different gray levels. This method is simple, efficient and easy to be implemented.

A method for manufacturing a display panel is provided according to an embodiment of the present disclosure. The method includes: forming multiple temperature-induced transmittance reversible components which are not contacted with each other and arranged in an array on a substrate, in such a manner that each of the temperature-induced transmittance reversible components includes a temperature-induced transmittance reversible unit and a temperature control unit which is used to adjust temperature of the temperature-induced transmittance reversible unit to control transmittance of the temperature-induced transmittance reversible unit with respect to the visible light.

The specific material of the temperature-induced transmittance reversible unit and the specific structure of the temperature control unit are not defined herein, as long as the above-described requirements are satisfied.

The display panel fabricated with the above-described method includes the temperature-induced transmittance reversible components, which have different transmittances with respect to the visible light at different temperatures. The display panel is applied into the electronic paper, and the amount of incident light can be controlled, thereby achieving different displays.

If materials of the temperature-induced transmittance reversible unit are different, the specific methods for manufacturing the same are different, which are illustrated below with examples.

First example, the forming multiple temperature-induced transmittance reversible components which are not contacted with each other and arranged in an array on a substrate specifically includes: forming a temperature-induced transmittance reversible film on the substrate and patterning the temperature-induced transmittance reversible film to form multiple temperature-induced transmittance reversible units which are not contacted with each other and arranged in an array, where the temperature-induced transmittance reversible film is made by mixing a water-soluble polymer, an inorganic salt, a curing agent and water.

The above-mentioned water-soluble polymer is any one or combination of polystyrene, oxidized polypropylene, polyvinyl alcohol, hydroxyethylcellulose, hydroxypropylcellulose, and the inorganic salt is any one or combination of sodium salt, potassium salt, magnesium salt, calcium salt. The above-mentioned curing agent may be Xanthan gum, carrageenan, gellan gum or the like herein.

The above-described material of the temperature-induced transmittance reversible unit obtained by mixing a water-soluble polymer, an inorganic salt, a curing agent and water is solid, multiple temperature-induced transmittance reversible units which are not contacted with each other and arranged in an array can be fabricated by means of a patterning process, which may be fabricated before the thermal insulating layer is formed, or may also be fabricated after the thermal insulating layer is formed. Compared with the capsule rotating ball in the related art, there is no need to additionally fabricate a container such as a capsule, thereby reducing the fabrication difficulty and cost.

Second example, optionally, the above-described method further includes: forming a thermal insulating film on the substrate and patterning the thermal insulating film to form a netlike thermal insulating layer.

The forming multiple temperature-induced transmittance reversible components which are not contacted with each other and arranged in an array on a substrate specifically includes: filling a fluid temperature-induced transmittance reversible material into netlike regions of the thermal insulating layer, where the temperature-induced transmittance reversible material is obtained by mixing a water-soluble polymer, an inorganic salt and water.

The above-mentioned water-soluble polymer is any one or combination of polystyrene, oxidized polypropylene, polyvinyl alcohol, hydroxyethylcellulose, hydroxypropylcellulose, and the inorganic salt is any one or combination of sodium salt, potassium salt, magnesium salt, calcium salt.

The above-described material of the temperature-induced transmittance reversible unit obtained by mixing a water-soluble polymer, an inorganic salt and water is liquid, and has fluidity. In order to obtain multiple temperature-induced transmittance reversible units which are not contacted with each other and arranged in an array, it is need to fill the above-described fluid temperature-induced transmittance reversible material into the netlike regions of the thermal insulating layer to fabricate the temperature-induced transmittance reversible units.

Of course, the above-described method for manufacturing the display panel may further include: forming a transparent packaging layer, forming multiple reflection units arranged in an array, forming black matrices or the like, which may be fabricated by referring the related art, and the detailed description is omitted.

The foregoing description is merely illustrative of particular embodiments of the invention, but the scope of the invention is not limited thereto, and any variations or substitutions which can readily occur to those skilled in the art without departing from the spirit of the invention shall come into the scope of the invention as defined in the appended claims.

What is claimed is:

1. A display panel, comprising:
   a first base substrate;
   a second base substrate arranged oppositely to the first base substrate; and
   a plurality of temperature-induced transmittance reversible components that are not contacted with each other and arranged in an array between the first base substrate and the second base substrate;
   wherein each of the plurality of temperature-induced transmittance reversible components comprises: a temperature-induced transmittance reversible unit and a temperature control unit, the temperature control unit is configured to adjust temperature of the temperature-induced transmittance reversible unit to control transmittance of the temperature-induced transmittance reversible unit with respect to visible light;
   wherein the display panel further comprises a plurality of reflection units arranged in an array;
   wherein each of the plurality of reflection units is composed of monochrome reflectors for reflecting light waves of different colors; wherein light of one color can be reflected by each of the monochrome reflectors included in each of the plurality of reflection units, and light of different colors can be reflected by each of the plurality of reflection units after light reflected by multiple monochrome reflectors is mixed;
   wherein each of the monochrome reflectors corresponds to one of the plurality of temperature-induced transmittance reversible components in a direction perpendicular to the display panel, and different monochrome reflectors correspond to different temperature-induced transmittance reversible components;
   wherein each of the plurality of temperature-induced transmittance reversible components and a corresponding one of the plurality of reflection units are arranged sequentially in a light incidence direction of the display panel.

2. The display panel according to claim 1, wherein the temperature control unit is a heating unit and the heating unit is in contact with the temperature-induced transmittance reversible unit.

3. The display panel according to claim 2, further comprising:
   a plurality of gate lines and a plurality of data lines which are crisscrossed, a voltage line and a plurality of thin film transistors, wherein each of the plurality of temperature-induced transmittance reversible components corresponds to one of the plurality of thin film transistors, wherein gate electrodes of thin film transistors in each line are connected to one of the gate lines, each drain electrode of each of the thin film transistors in each line is connected to a first connection terminal of a corresponding heating unit in each line, source electrodes of the thin film transistors in each line are connected to one of the data lines, and a second connection terminal of each of the corresponding heating unit is connected to the voltage line.

4. The display panel according to claim 1, further comprising a thermal insulating layer which separates all of the temperature-induced transmittance reversible components from each other.

5. The display panel according to claim 4, wherein the temperature-induced transmittance reversible unit is a mixture of a water-soluble polymer, an inorganic salt and water.

6. The display panel according to claim 5, wherein the water-soluble polymer is any one or combination of polystyrene, oxidized polypropylene, polyvinyl alcohol, hydroxyethylcellulose, hydroxypropylcellulose, and the inorganic salt is any one or combination of sodium salt, potassium salt, magnesium salt, calcium salt.

7. The display panel according to claim 1, wherein the temperature-induced transmittance reversible unit is a mixture of a water-soluble polymer, an inorganic salt, a curing agent and water.

8. The display panel according to claim 1, further comprising a transparent packaging layer, wherein the transparent packaging layer packages the plurality of temperature-induced transmittance reversible components.

9. The display panel according to claim 1, wherein each of the monochrome reflectors comprises: a reflection subunit and a monochrome subunit, the monochrome subunit is capable of passing only light of one color through; the monochrome subunit and the reflection subunit are arranged sequentially in the light incidence direction of the display panel.

10. The display panel according to claim 1, wherein each of the plurality of reflection units comprises: a red reflection subunit, a green reflection subunit and a blue reflection subunit.

11. The display panel according to claim 1, further comprising black matrices arranged among the monochrome reflectors.

12. The display panel according to claim 1, wherein each of plurality of the temperature-induced transmittance reversible components and the corresponding one of the plurality of reflection units are arranged on an inside of one of the first base substrate and the second base substrate.

13. The display panel according to claim 1, wherein each of the plurality of temperature-induced transmittance reversible components and the corresponding one of the plurality of reflection units are arranged on an inside of the first base substrate and an inside of the second base substrate, respectively.

14. The display panel according to claim 1, wherein in each of the plurality of temperature-induced transmittance reversible components, the temperature control unit is within the temperature-induced transmittance reversible unit.

15. An electronic paper, comprising the display panel according to claim 1.

16. A driving method for an electronic paper according wherein the electronic paper comprises a display panel that includes:

a first base substrate;

a second base substrate arranged oppositely to the first base substrate; and a plurality of temperature-induced transmittance reversible components that are not contacted with each other and arranged in an array between the first base substrate and the second base substrate;

wherein each of the plurality of temperature-induced transmittance reversible components comprises: a temperature-induced transmittance reversible unit and a temperature control unit, the temperature control unit is configured to adjust temperature of the temperature-induced transmittance reversible unit to control transmittance of the temperature-induced transmittance reversible unit with respect to visible light; wherein the temperature control unit is a heating unit and the heating unit is in contact with the temperature-induced transmittance reversible unit;

wherein the display panel of the electronic paper further comprises: a plurality of gate lines and a plurality of data lines which are crisscrossed, a voltage line and a plurality of thin film transistors, each of the temperature-induced transmittance reversible components corresponds to one of the plurality of thin film transistors, gate electrodes of thin film transistors in each line are connected to one of the plurality of gate lines, each drain electrode of each of the thin film transistors in each line is connected to a first connection terminal of the a corresponding heating unit in each line, source electrodes of the thin film transistors in each line are connected to one of the plurality of data lines, and a second connection terminal of each of the corresponding heating unit is connected to the voltage line;

wherein the method comprises:

inputting a scanning signal to each of the plurality of gate lines sequentially according to sequences of the plurality of gate lines; and inputting a data signal to source electrodes of the plurality of thin film transistors connected to any one of the plurality of gate lines through the plurality of data lines to control the corresponding heating unit connected to each of the plurality of thin film transistors to generate heat, when a gate line is scanned.

17. A method for manufacturing a display panel, comprising:

forming a plurality of temperature-induced transmittance reversible components that are not contacted with each other and arranged in an array on a substrate, in such a manner that each of the plurality of temperature-induced transmittance reversible components comprises a temperature-induced transmittance reversible unit and a temperature control unit, and the temperature control unit is configured to adjust temperature of the temperature-induced transmittance reversible unit to control transmittance of the temperature-induced transmittance reversible unit with respect to visible light; and forming a thermal insulating film on the substrate and patterning the thermal insulating film to form a netlike thermal insulating layer;

wherein the forming the plurality of temperature-induced transmittance reversible components that are not contacted with each other and arranged in the array on the substrate comprises:

filling a fluid temperature-induced transmittance reversible material into netlike regions of the thermal insulating layer, wherein the temperature-induced transmittance reversible material is obtained by mixing a water-soluble polymer, an inorganic salt and water.

18. The method according to claim 17, wherein the forming the plurality of temperature-induced transmittance reversible components that are not contacted with each other and arranged in the array on the substrate comprises:

forming a temperature-induced transmittance reversible film on the substrate and patterning the temperature-induced transmittance reversible film to form a plurality of temperature-induced transmittance reversible units that are not contacted with each other and arranged in an array, wherein the temperature-induced transmittance reversible film is made by mixing a water-soluble polymer, an inorganic salt, a curing agent and water.

\* \* \* \* \*